United States Patent
Kluge et al.

(10) Patent No.: US 6,937,849 B2
(45) Date of Patent: Aug. 30, 2005

(54) MIXING APPARATUS

(75) Inventors: Wolfram Kluge, Dresden (DE); Heiko Kaluzni, Grossenhain (DE); Dietmar Eggert, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 431 days.

(21) Appl. No.: 10/324,783

(22) Filed: Dec. 20, 2002

(65) Prior Publication Data

US 2004/0063418 A1 Apr. 1, 2004

(30) Foreign Application Priority Data

Sep. 30, 2002 (DE) .......................................... 101 45 609

(51) Int. Cl.$^7$ ................................................. H04B 1/28
(52) U.S. Cl. ....................... 455/333; 455/323; 455/315; 327/113
(58) Field of Search ................................ 455/313, 315, 455/323, 333, 326, 327; 327/113, 408, 356

(56) References Cited

U.S. PATENT DOCUMENTS

| 4,268,916 | A | * | 5/1981 | Kusakabe | 455/333 |
|---|---|---|---|---|---|
| 5,043,609 | A | * | 8/1991 | Uno et al. | 327/113 |
| 5,448,197 | A | * | 9/1995 | Sagawa et al. | 327/113 |
| 6,026,286 | A | * | 2/2000 | Long | 455/327 |
| 6,205,325 | B1 | | 3/2001 | Groe | |
| 6,239,645 | B1 | | 5/2001 | Tsukahara et al. | |
| 6,308,058 | B1 | * | 10/2001 | Souetinov et al. | 455/323 |
| 6,653,885 | B2 | * | 11/2003 | Wu et al. | 327/356 |
| 2003/0162515 | A1 | * | 8/2003 | Zhou | 455/323 |
| 2003/0216128 | A1 | * | 11/2003 | Zhou | 455/313 |
| 2004/0137871 | A1 | * | 7/2004 | McNamara et al. | 455/326 |

FOREIGN PATENT DOCUMENTS

| EP | 0 698 964 A1 | 2/1996 |
|---|---|---|
| EP | 1 073 205 A2 | 1/2001 |

* cited by examiner

*Primary Examiner*—Edward F. Urban
*Assistant Examiner*—Lana Le
(74) *Attorney, Agent, or Firm*—Meyertons Hood Kivlin Kowert & Goetzel, P.C.; B. Noël Kivlin (57) ABSTRACT

A mixer circuit is provided for receiving first and second input signals to be mixed and for producing a mixed output signal. The mixer circuit comprises a pair of switching transistors each of which having first, second and third terminals. The mixer circuit further comprises a single ended input connected to the first terminals of the pair of switching transistors, a local oscillator input connected to the second terminals of the pair of switching transistors for controlling the switching of the transistors, a serial capacitor connected in serial connection between the single ended input and the first terminals of the pair of switching transistors, a pair of output capacitors each of which being connected to a third terminal of the pair of switching transistors. Said third terminals of said pair of switching transistors forming an output port. The mixer circuit provides a mixer schematic with improved noise performance.

13 Claims, 5 Drawing Sheets

MIXING APPARATUS

BACKGROUND OF THE INVENTION

1. Field of the Invention

The invention generally relates to wireless communication devices, and more particularly, to mixer circuits on integrated circuits that are used for converting between radio frequency (RF) signals and baseband signals in wireless communication devices.

2. Description of the Related Art

The increasing usage of wireless communication devices like cellular phones and other types of wireless communication devices is based on significantly improved technologies allowing to provide integrated circuits implementing the electronic necessary for wireless communication at a smaller size and, at the same time, at a reduced price. A key component of a wireless communication device is a mixer circuit. The mixer circuit may be operated for up-conversion allowing to convert an input frequency to the radio frequency (RF) or for down-conversion allowing to convert the frequency between the radio frequency (RF) received by a wireless communication device and baseband signals or intermediate frequency (IF) signals to be further processed by the wireless communication device. The down-conversion of RF signals is crucial for the extraction of information carried on a desired RF signal among all the other information carried by other RF signals.

Although the super-heterodyne receiver is still the most common architecture, the direct conversion receiver has gained much attention in recent years as a possible solution for a single-chip receiver as the direct conversion receiver does not require any other off-chip structures in the signal path. Direct conversion offers a lot of advantages over its predecessor technology, the super-heterodyne architecture. It eliminates the need for many components, resulting in wireless communication devices with reduced cost and size. In particular the entire intermediate frequency subsection is eliminated.

Although the direct conversion architecture does not require the use of external filters, there is still a number of problems to be solved, among which the DC offset generated and the flicker noise are the most critical.

The frequency translation in a direct conversion receiver or a super-heterodyne receiver is performed by a mixer. Mixer topologies are classified as active or passive according to the mixer's ability to provide gain or not. Both types can be realized in CMOS technology. Active mixers achieve conversion gain and require reduced local oscillator (LO) power. The primary advantage of passive mixers is increased dynamic range at the expense of LO power.

It is further to be differentiated between single balanced mixers and double balanced mixers. Single balanced mixers reject one of the input or LO signals at the output, while double balanced mixers reject both. Single and double balanced mixers are both used in practice. A particular double balanced structure which is popular for use in integrated receivers is known as Gilbert cell mixer.

In most configurations, a mixer performs a frequency translation by commutating a current signal with a switching differential pair driven by a strong LO voltage. The principle of operation is the same for bipolar and CMOS technologies.

Figure 1:
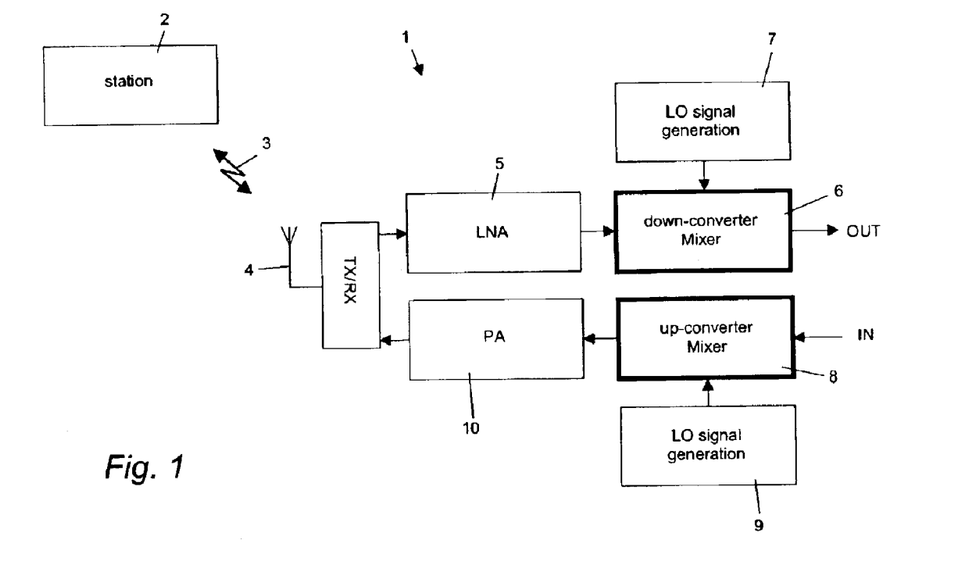
FIG. 1 is a block diagram illustrating the general configuration of a wireless communication device including a down-converter mixer and an up-converter mixer.

An exemplary embodiment of a wireless communication device is shown in FIG. 1. The communication device 1 is connected to a station 2 via a wireless communication link 3. The communication device 1 is designed for transmitting and receiving signals via antenna 4. A communication signal transmitted from station 2 to the communication device 1 is received by antenna 4 and propagated to low a noise amplifier (LNA) 5 for amplifying the received radio signal. A down-converter mixer 6 converts the radio frequency to a lower frequency. The down-conversion is performed in the mixer 6 by multiplying the received RF signal with a local oscillator (LO) signal provided by LO signal generator 7. In the reverse direction, a low frequency input signal is received by up-converter 8 and converted to a radio frequency (RF). The up-conversion is carried out by up-converter mixer 8 multiplying the input signal and the LO signal provided by LO signal generator 9. The output RF signal is applied to power amplifier (PA) 10 and transmitted via antenna 4 to station 2.

Figure 2:
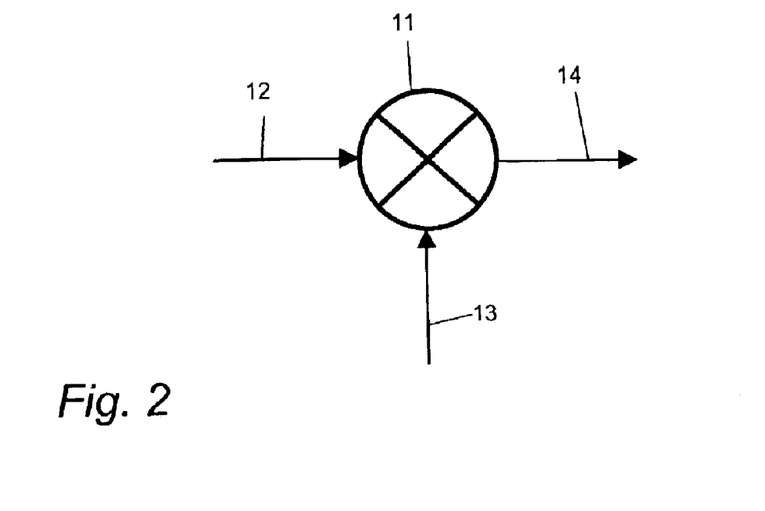
FIG. 2 is a block diagram generally illustrating the configuration of a mixer circuit.

Referring to FIG. 2, the basic principle of a mixer as used for instance in the above-mentioned up-converter 8 and down-converter 6 is shown. Mixer 11 receives two signal inputs, namely a first input signal 12 having a frequency F1 and a second input signal 13 having a frequency F2. The mixer 11 transforms these frequencies by multiplication into an output signal 14. The output signal comprises a differential frequency (either F1–F2 or F2–F1) and a sum frequency (F1+F2) of the input frequencies F1 and F2.

In a transmitter as described for instance in FIG. 1 the baseband frequency is transformed into a radio frequency. For this purpose, the sum frequency of the mixer is used in the up-conversion mixer. In contrast, a receiver transforms the received radio frequency into the baseband signal. For this purpose, the difference frequency supplied by the mixer is used.

Figure 3:
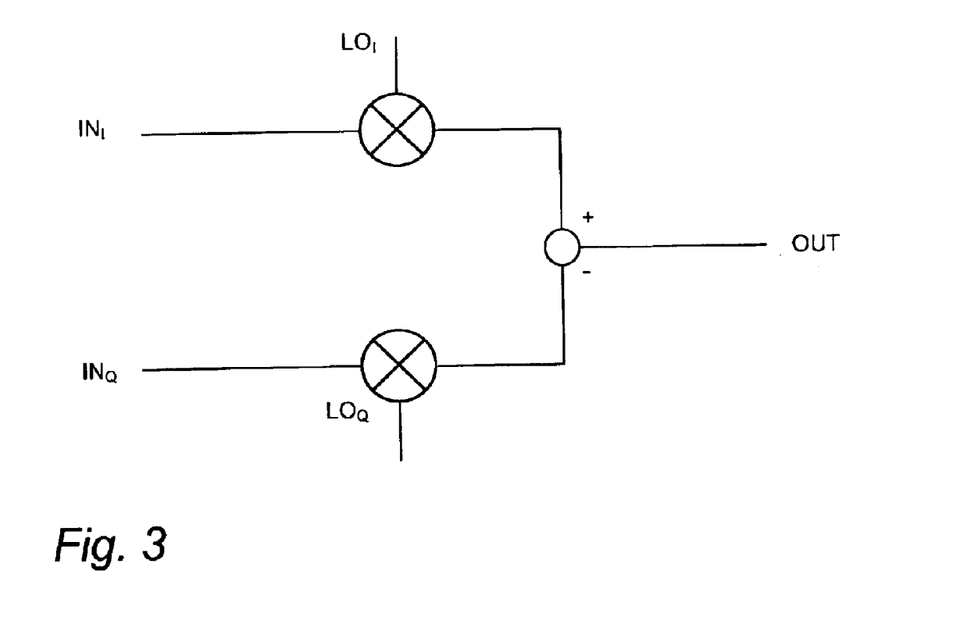
FIG. 3 is a block diagram illustrating the general configuration of an image rejection mixer.

The unwanted signal, the image frequency, may be incident on a converter mixer. The unwanted signal at the image frequency may be rejected by an image rejection mixer, the principle of which is shown in FIG. 3. Such an image rejection mixer is intended for the conversion of signals having signal components in quadrature. When both signals are mixed with an LO signal they have a 180 degrees delay at the output between the image and the wanted signal. A simple subtraction at the output generates the rejection of the image.

Figure 4:
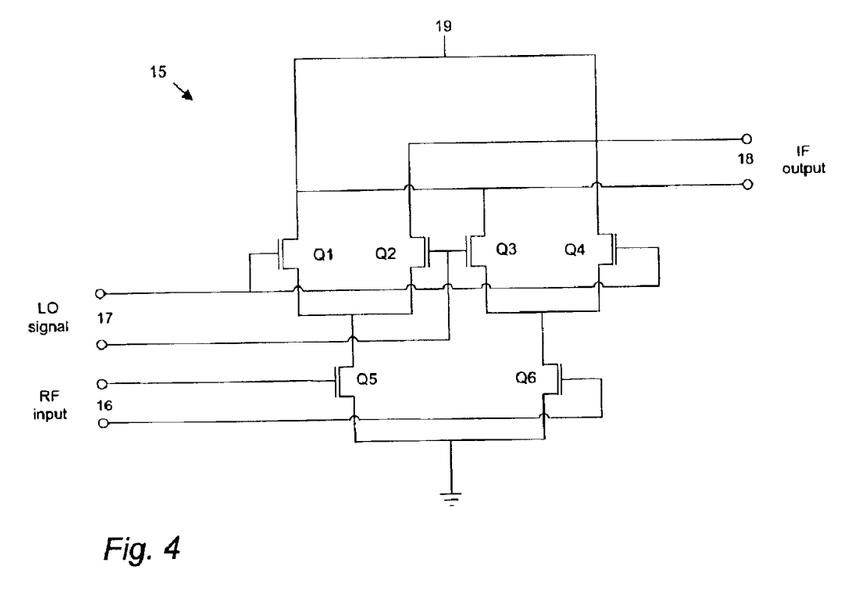
FIG. 4 is a schematic diagram illustrating the circuit configuration of a Gilbert cell mixer.

An example of a double balanced active mixer is shown in FIG. 4. The mixer illustrated in FIG. 4 is commonly known as a Gilbert cell mixer. The Gilbert cell mixer comprises a mixer core including four transistors Q1, Q2, Q3, Q4 and a RF input section including transistors Q5 and Q6. The transistors of the mixer core Q1, Q2, Q3 and Q4 are differentially connected in a common emitter configuration and in turn connected to a differentially connected pair of transistors Q5 and Q6.

As shown in FIG. 4, the Gilbert cell mixer has two input ports 16, 17 and one output port 18. The LO signal is applied to the LO input port 17 and, when used in a down-converter, the RF input signal is applied to the RF input port 16. The resulting IF signal is provided at the intermediate (IF) output port 18. Further, the mixer circuit comprises a supply voltage input 19.

The RF input port 16 receives two RF signals from an antenna, while the LO input port 17 receives two LO signals provided by a LO circuit. Such an LO circuit is included with a wireless communication device as shown for instance in FIG. 1. The two RF signals are inverted (i.e. 180 degrees out of phase) with respect to each other, as are the two LO signals. The double balanced mixer 15 multiplies the RF signal and the LO signal provided at the RF and LO input ports 16, 17, respectively, to produce first and second intermediate signals at the IF output port 18.

Such mixers have still a number of problems. One problem is that Gilbert cell mixers produce spurious signals due to transistor size miss-match and other circuit imperfections. These spurious signals degrade the performance of a direct-conversion receiver.

Another problem of Gilbert cell mixers is flicker noise from the mixer commutating switches, especially in CMOS implementations. MOS transistor flicker noise degrades the mixer noise performance for low output frequencies that are exploited in a direct conversion receiver. Flicker noise does not only degrade the noise performance of these mixers, but also adds noise directly to the base band.

An additional well-known problem of the Gilbert cell mixer architecture are DC offsets.

In view of these drawbacks of the prior art it is therefore the primary object of the invention to provide an improved mixer circuit, an improved direct conversion receiver and an improved method for operating a mixer circuit.

SUMMARY OF THE INVENTION

An improved mixer circuit, direct conversion receiver and method for operating a mixer circuit are provided that show in particular an improved noise performance.

In one embodiment, a mixer circuit is provided for receiving first and second input signals to be mixed and for producing a mixed output signal. The mixer circuit comprises a pair of switching transistors each of which having first, second and third terminals. The mixer circuit further comprises a single ended input connected to the first terminals of the pair of switching transistors, a local oscillator input connected to the second terminals of the pair of switching transistors for controlling the switching of the transistors, a serial capacitor connected in serial connection between the single ended input and the first terminals of the pair of switching transistors, a pair of output capacitors each of which being connected to a third terminal of the pair of switching transistors. Said third terminals of said pair of switching transistors forming an output port.

In another embodiment, a direct conversion receiver is provided including a mixer circuit. The mixer circuit comprises a pair of switching transistors each of which having first, second and third terminals. The mixer circuit further comprises a single ended input connected to the first terminals of the pair of switching transistors, a local oscillator input connected to the second terminals of the pair of switching transistors for controlling the switching of the transistors, a serial capacitor connected in serial connection between the single ended input and the first terminals of the pair of switching transistors, a pair of output capacitors each of which being connected to a third terminal of the pair of switching transistors.

Said third terminals of said pair of switching transistors forming an output port for outputting the converted signal.

In still another embodiment, a means is provided for mixing first and second input signals and for producing a mixed output signal. The means comprises a switching pair, a single ended input connected to said switching pair, a local oscillator input for controlling the switching pair, a serial capacitor connected in serial connection between the single ended input and the switching pair, and a pair of output capacitors each of which being connected to an output of one of the switches of said switching pair.

In still another embodiment, a method is provided for operating a mixer circuit to convert a frequency of an input signal. The method receives an input signal of a first frequency, commutes the input current flowing through serial capacitor by a pair of switching transistors which are driven by local oscillator signals of a second frequency, respectively, and outputs the commutated input current to output capacitors, respectively, to produce a differential output signal.

Further embodiments are the subject matter of dependent claims.

BRIEF DESCRIPTION OF THE DRAWINGS

The accompanying drawings are incorporated into and form a part of this specification for the purpose of explaining the principles of the invention. The drawings are not to be construed as limiting the invention to only the illustrated and described examples of how the invention can be made and used. Further features and advantages could become apparent from the following and more particular description of the invention, as illustrated in the accompanying drawings, wherein.

DETAILED DESCRIPTION OF THE INVENTION

The illustrative embodiments of the present invention will be described with reference to the Figure drawings.

Figure 5:
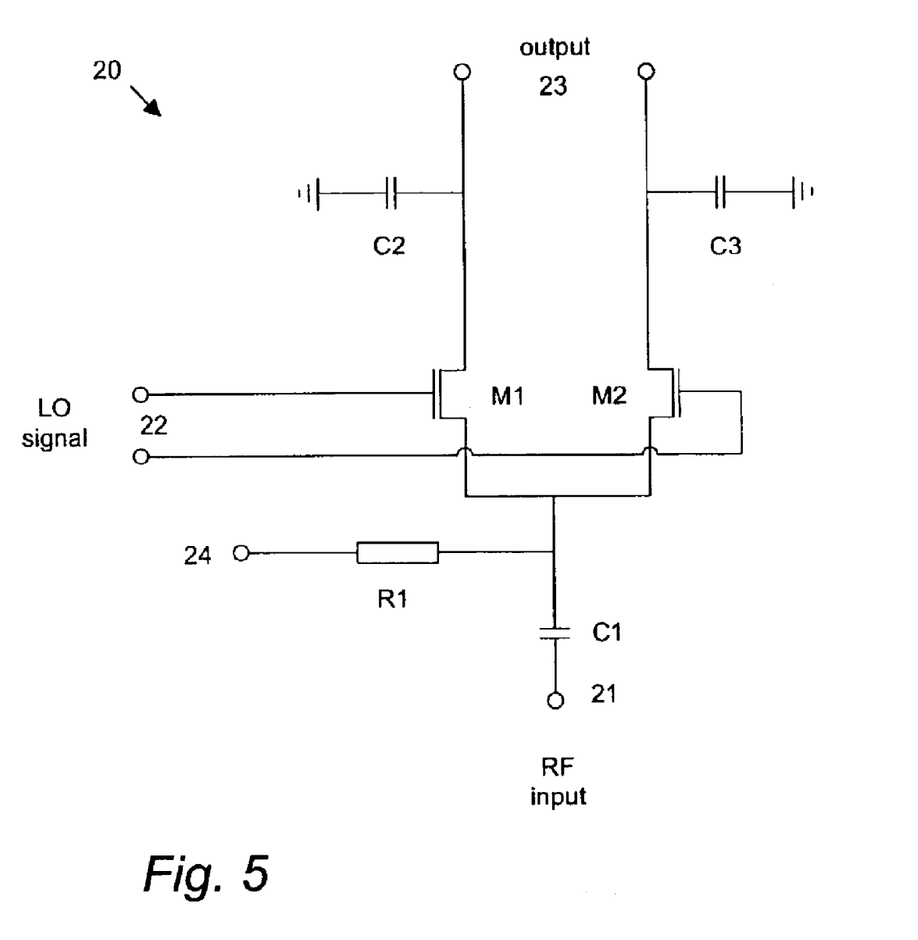
FIG. 5 is a schematic diagram illustrating the circuit configuration of a mixer.

Referring to the drawings and in particular to FIG. 5, one embodiment of a mixer circuit 20 is shown. The mixer includes a RF input 21, and a LO input port 22. The RF input 21 receives a RF signal from an antenna, while the LO input port 22 receives the two LO signals provided by the LO circuit. The two LO signals are inverted (i.e. 180 degrees out of phase) with respect to each other.

The mixer further includes a pair of switching transistors M1, M2, the bases of which form LO input port 22. Specifically, transistor M1 receives a first LO input signal and transistor M2 receives a second LO input signal, wherein the two LO input signals are inverted with respect to one another.

The sources of transistors M1, M2 are coupled via capacitor C1 to the RF input 21. The drain of the transistors M1, M2 form an output port 23. Each of the collectors of transistors M1, M2 are further coupled to ground via respective output capacitors C2 and C3.

Mixer circuit 20 further comprises a bias resistor R1 which is connected to a supply voltage 24 and to the common node of serial capacitor C1 and the source of both transistors M1, M2.

The mixer circuit 20 is operated to multiply the single ended RF signal at RF input 21 and the LO signals at LO input port 22 to produce a differential output signal at output port 23. The output signal is a voltage and sensed by a high-resistance amplifier (not shown). The two MOS transistors M1, M2 commutate the RF input current flowing through capacitor C1 to output capacitors C2, C3. The MOS transistor gates are driven by the LO signal. The DC operation point is adjusted in a way that only one of both transistors M1, M2 is on at a time.

The serial capacitor C1 connected between the RF input and both connected source has a large impact on the mixer performance. Serial capacitor C1 form together with the output capacitors C2, C3 a low pass filter of first order. The cut-off frequency $f_c$ of the low pass filter is determined by the following formula:

$$f_c = K \cdot f_{LO} \cdot \frac{C1}{C2}$$

In this formula, K denotes a factor describing the dependency on the transistor sizes and the LO signal magnitude. In particular, as charging and discharging of C1 is not complete in each LO signal cycle. This low pass filter behaviour may be employed in a receiver for attenuating adjacent channel signals being usually much stronger than the desired signal.

Figure 6:
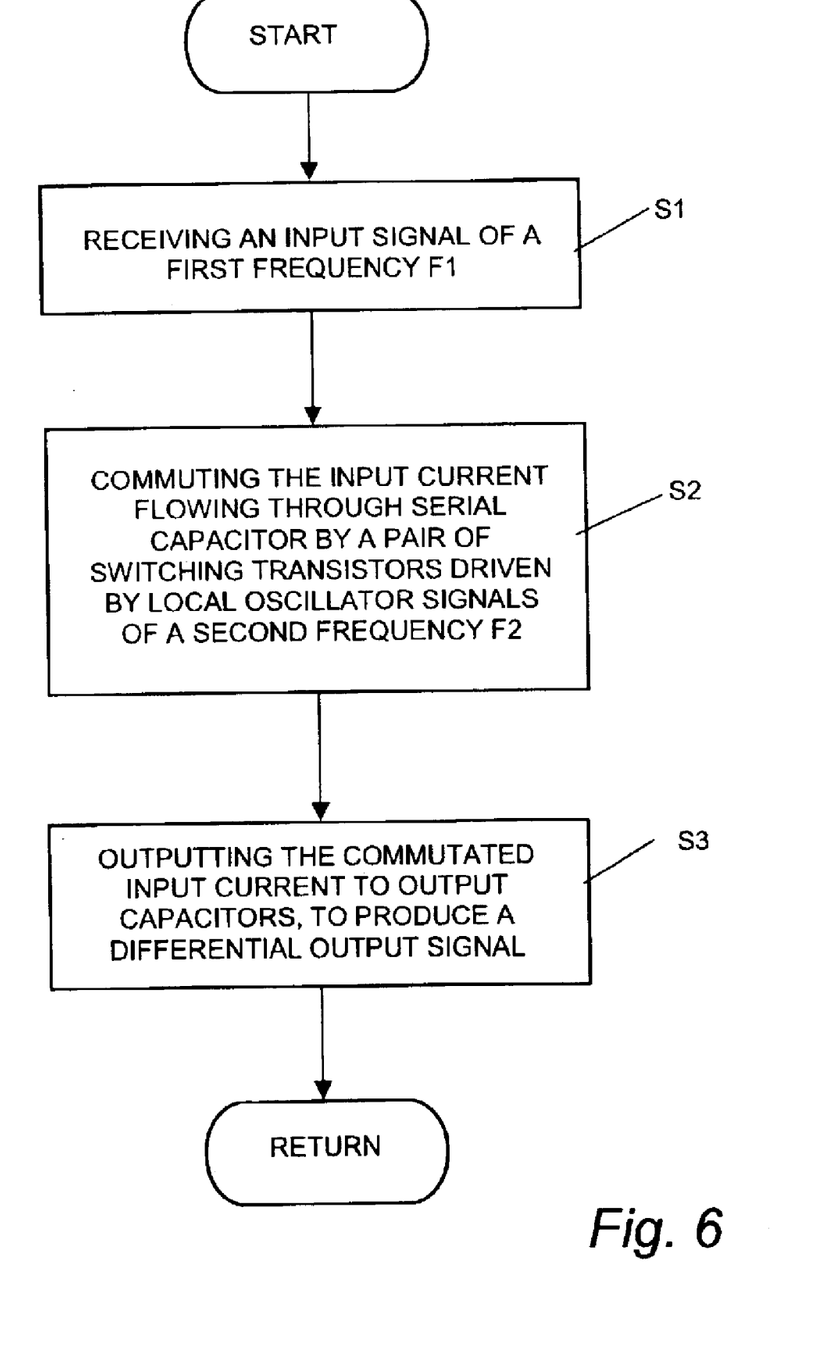
FIG. 6 is a flow chart illustrating a method of operating a mixer circuit.

A flow chart illustrating a method of operating a mixer circuit is shown in FIG. 6. An input signal of a first frequency F1 (step S1) is received through input 21. The input current flowing through serial capacitor C1 is commutated in step S2 by the pair of switching transistors M1, M2. The switching transistors are driven by local oscillator signals having a second frequency F2. The resulting mixed signal is output in step S3 to capacitors C2, C3 to produce a differential output signal.

The above described mixer circuit 20 increases the operating speed and improves efficiency, accuracy and signal-to-noise ratio. In particular, it is a major advantage of the mixer circuit 20 over prior art mixer topologies like the Gilbert cell mixer that the mixer 20 is passive. The mixer 20 does not have a DC bias current flowing through the mixer transistors M1, M2. In case of transistor mismatch in a Gilbert cell mixer, the DC current generates a second order non-linearity, DC offset voltage at the LO signal or any impairment of the LO signal balance. Due to the passive nature of the mixer circuit 20, the sensitivity to the above-mentioned imperfections is considerably reduced. In addition, the transistors do not contribute to flicker noise in the output signal. Flicker noise originates in the transistor gates and appears at the drain only when it is amplified by the transistor transconductance, which is proportional to the square root of the drain DC current.

Thus, the mixer circuit 20 provides a mixer schematic with improved characteristics, in particular improved noise performance.

While the invention has been described with respect to the physical embodiments constructed in accordance therewith, it will be apparent to those skilled in the art that various modifications, variations and improvements of the present invention may be made in light of the above teachings and within the purview of the independent claims without departing from the spirit and the intended scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the dependent claims.

What is claimed is:

1. A mixer circuit for receiving first and second input signals to be mixed and for producing a mixed output signal, comprising:
    a pair of switching transistors, each of which having first, second and third terminals,
    a single ended input connected to the first terminals of the pair of switching transistors,
    a local oscillator input connected to the second terminals of the pair of switching transistors for controlling the switching of the transistors,
    a serial capacitor connected in serial connection between the single ended input and the first terminals of the pair of switching transistors, and
    a pair of output capacitors, each of which being connected to a third terminal of the pair of switching transistors, said third terminals of said pair of switching transistors forming a mixer output port.

2. The mixer circuit according to claim 1, wherein said transistors being MOS transistors and said first, second and third terminal being source, gate and drain, respectively.

3. The mixer circuit according to claim 1, wherein each said output capacitors being further connected to ground.

4. The mixer circuit according to claim 1, wherein said serial capacitor and said output capacitors forming a low pass filter.

5. The mixer circuit according to claim 4, wherein said serial capacitor and said output capacitors forming a first order low pass filter.

6. The mixer circuit according to claim 1, wherein only one of both transistors is operated at a time.

7. The mixer circuit according to claim 1, wherein said single ended input receiving a RF signal and said output port providing a differential base band signal.

8. The mixer circuit according to claims 1, wherein said pair of switching transistors connecting said single ended input with one terminal of said output port, respectively.

9. An integrated circuit structure having a mixer circuit according to claim 1 formed as a part thereof.

10. A direct conversion receiver for down-converting an RF input signal to a base band signal including a mixer circuit, said mixer circuit comprising:
    a pair of switching transistors, each of which having first, second and third terminals,
    a single ended input connected to the first terminals of the pair of switching transistors,
    a local oscillator input connected to the second terminals of the pair of switching transistors for controlling the switching of the transistors,
    a serial capacitor connected in serial connection between the single ended input and the first terminals of the pair of switching transistors, and
    a pair of output capacitors, each of which being connected to a third terminal of the pair of switching transistors, said third terminals of said pair of switching transistors forming an output port for outputting the converted signal.

11. An integrated circuit structure having a direct conversion receiver according to claim 10 formed as a part thereof.

12. A means for mixing first and second input signals and for producing a mixed output signal, comprising:
    a switching pair,
    a single ended input connected to said switching pair,
    a local oscillator input for controlling the switching pair,
    a serial capacitor connected in serial connection between the single ended input and the switching pair, and a pair of output capacitors, each of which being connected to an output of one of the switches of said switching pair.

13. A method for operating a mixer circuit to convert a frequency of an input signal, comprising the steps of:

receiving an input signal of a first frequency, commuting the input current flowing through serial capacitor by a pair of switching transistors driven by local oscillator signals of a second frequency, respectively, and outputting the commutated input current to output capacitors, respectively, to produce a differential output signal.

* * * * *

UNITED STATES PATENT AND TRADEMARK OFFICE
CERTIFICATE OF CORRECTION

| | |
|---|---|
| PATENT NO. | : 6,937,849 B2 |
| APPLICATION NO. | : 10/324783 |
| DATED | : August 30, 2005 |
| INVENTOR(S) | : Kluge et al. |

It is certified that error appears in the above-identified patent and that said Letters Patent is hereby corrected as shown below:

In the Specification:

Column 4, Line 2, please replace "frequency, commutes" with "frequency, commutates".

In the Claims:

Claim 13, Column 7, Line 7, please replace the line

"commuting the input current flowing through serial"

with the line

"commutating the input current flowing through a serial".

Signed and Sealed this
Sixth Day of August, 2013

Teresa Stanek Rea
*Acting Director of the United States Patent and Trademark Office*